(12) United States Patent
Tanaka (10) Patent No.: US 8,093,612 B2
(45) Date of Patent: Jan. 10, 2012

(54) ORGANIC EL DISPLAY DEVICE AND MANUFACTURING METHOD THEREOF

(75) Inventor: Masahiro Tanaka, Chiba (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 83 days.

(21) Appl. No.: 12/574,750

(22) Filed: Oct. 7, 2009

(65) Prior Publication Data

US 2010/0084676 A1 Apr. 8, 2010

(30) Foreign Application Priority Data

Oct. 8, 2008 (JP) ................................. 2008-261871

(51) Int. Cl.
 *H01L 33/00* (2010.01)
(52) U.S. Cl. ............... 257/98; 257/40; 257/E51.028; 257/E21.211; 257/E21.09; 257/E21.414; 438/29; 438/158; 438/487; 438/23; 438/24; 455/24; 455/25
(58) Field of Classification Search ............ 257/40, 257/98, E51.028, E21.211, E21.09, E21.414, 257/E33.053, 787, E33.061, E21.158; 438/23–26, 438/29, 158, 487
See application file for complete search history.

(56) References Cited

U.S. PATENT DOCUMENTS

| | | | | |
|---|---|---|---|---|
| 4,357,557 A * | 11/1982 | Inohara et al. | ............... | 313/509 |
| 5,688,551 A | 11/1997 | Littman et al. | | |
| 6,037,712 A * | 3/2000 | Codama et al. | ............... | 313/498 |
| 6,137,220 A * | 10/2000 | Nagayama et al. | ........... | 313/504 |
| 6,351,066 B1 * | 2/2002 | Gyoutoku et al. | ............. | 313/504 |
| 6,429,584 B2 * | 8/2002 | Kubota | .......................... | 313/504 |
| 6,646,284 B2 * | 11/2003 | Yamazaki et al. | ............... | 257/40 |
| 6,768,257 B1 * | 7/2004 | Yamada et al. | ................ | 313/504 |
| 6,850,005 B2 * | 2/2005 | Yoneda et al. | ................ | 313/506 |
| 7,095,170 B2 * | 8/2006 | Matsuki et al. | ............... | 313/506 |
| 7,109,653 B2 * | 9/2006 | Imamura | ....................... | 313/512 |
| 7,199,516 B2 * | 4/2007 | Seo et al. | ....................... | 313/504 |
| 7,259,106 B2 * | 8/2007 | Jain | ............................... | 438/737 |
| 7,323,819 B2 * | 1/2008 | Hong et al. | ................... | 313/584 |
| 7,327,079 B2 * | 2/2008 | Yoon | .............................. | 313/504 |
| 7,336,031 B2 * | 2/2008 | Chung et al. | .................. | 313/506 |

(Continued)

FOREIGN PATENT DOCUMENTS

JP 09-167684 6/1997

(Continued)

*Primary Examiner* — N Drew Richards
*Assistant Examiner* — Ankush Singal
(74) *Attorney, Agent, or Firm* — Antonelli, Terry, Stout & Kraus, LLP.

(57) ABSTRACT

An organic EL display device forms an organic EL layer on a pixel portion by a transfer method without using a sophisticated optical system. A patterned light reflection layer is formed on a donor substrate. A light absorption layer is formed on the light reflection layer. An organic EL material layer is formed on the light absorption layer. An element substrate on which banks, lower electrodes and the like are formed is arranged to face a donor substrate in an opposed manner. When light is radiated to the donor substrate from a flash lamp or the like, only portions of the optical absorption layer where the light reflection layers are not formed are heated, and such portions of the organic EL material layer are evaporated and applied to a lower electrode formed on the element substrate. Due to such steps, the organic EL layer can be formed by a transfer method without using a sophisticated optical system.

10 Claims, 9 Drawing Sheets

U.S. PATENT DOCUMENTS

| | | | |
|---|---|---|---|
| 7,402,948 B2 * | 7/2008 | Yamazaki et al. | 313/506 |
| 7,432,217 B1 * | 10/2008 | Kim et al. | 438/775 |
| 7,453,094 B2 * | 11/2008 | Takayama et al. | 257/83 |
| 7,524,228 B2 * | 4/2009 | Imamura | 445/25 |
| 7,619,258 B2 * | 11/2009 | Tsuchiya et al. | 257/83 |
| 7,648,944 B2 * | 1/2010 | Matsuo et al. | 503/227 |
| 7,663,305 B2 * | 2/2010 | Yamazaki et al. | 313/506 |
| 7,667,284 B2 * | 2/2010 | Hayashi et al. | 257/433 |
| 7,781,963 B2 * | 8/2010 | Yoshida et al. | 313/506 |
| 7,781,973 B2 * | 8/2010 | Miyake et al. | 313/587 |
| 7,910,287 B2 * | 3/2011 | Kawakami et al. | 430/306 |
| 7,915,816 B2 * | 3/2011 | Kashiwabara et al. | 313/506 |
| 7,948,175 B2 * | 5/2011 | Kurihara | 313/512 |
| 2001/0054867 A1 * | 12/2001 | Kubota | 313/504 |
| 2003/0006698 A1 * | 1/2003 | Mayuzumi | 313/506 |
| 2003/0168974 A1 * | 9/2003 | Matsuki et al. | 313/506 |
| 2003/0201708 A1 * | 10/2003 | Yamada et al. | 313/495 |
| 2004/0022932 A1 * | 2/2004 | Kum et al. | 427/66 |
| 2004/0066136 A1 * | 4/2004 | Yoneda et al. | 313/505 |
| 2005/0057151 A1 * | 3/2005 | Kuwabara | 313/506 |
| 2005/0248266 A1 * | 11/2005 | Hosokawa | 313/504 |
| 2006/0243377 A1 | 11/2006 | Matsuo et al. | |
| 2006/0261337 A1 * | 11/2006 | Koma | 257/59 |
| 2007/0001602 A1 * | 1/2007 | Miyake et al. | 313/582 |
| 2007/0075626 A1 * | 4/2007 | Yu et al. | 313/500 |
| 2007/0102737 A1 * | 5/2007 | Kashiwabara et al. | 257/291 |
| 2007/0290609 A1 * | 12/2007 | Ishii et al. | 313/504 |
| 2008/0012472 A1 * | 1/2008 | Uchida | 313/504 |
| 2008/0018243 A1 * | 1/2008 | Ishiguro et al. | 313/506 |
| 2008/0042550 A1 * | 2/2008 | Matsuura et al. | 313/498 |
| 2008/0054801 A1 * | 3/2008 | Lee et al. | 313/504 |
| 2008/0272992 A1 * | 11/2008 | Kwak | 345/76 |
| 2009/0079336 A1 * | 3/2009 | Yamada et al. | 313/504 |
| 2009/0200924 A1 * | 8/2009 | Matsuzaki et al. | 313/504 |
| 2009/0224664 A1 * | 9/2009 | Yoshida et al. | 313/504 |
| 2009/0284146 A1 * | 11/2009 | Yoshida et al. | 313/504 |
| 2010/0007272 A1 * | 1/2010 | Toyoda et al. | 313/504 |

FOREIGN PATENT DOCUMENTS

JP  2006-309994  11/2006

* cited by examiner

ORGANIC EL DISPLAY DEVICE AND MANUFACTURING METHOD THEREOF

BACKGROUND OF THE INVENTION

1. Field of the Invention

The present invention relates to a display device, and more particularly to an organic EL display device of a type which forms organic EL layers using a transfer method, and a manufacturing method of the display device.

2. Background Art

In an organic EL display device, an organic EL layer is sandwiched between a lower electrode and an upper electrode, a fixed voltage is applied to the upper electrode and a data signal voltage is applied to the lower electrode so as to control emission of light from the organic EL layer thus forming an image. The data signal voltage is supplied to the lower electrode via a thin film transistor (TFT).

An organic EL display device is classified into a bottom-emission-type organic EL display device in which light emitted from organic EL layers is taken out in the direction of a glass substrate on which the organic EL layers and the like are formed, and a top-emission-type organic EL display device in which light emitted from organic EL layers is taken out in the direction opposite to a glass substrate on which the organic EL layers and the like are formed. The top-emission-type organic EL display device has an advantage that each organic EL layer can ensure a light emission area also on a TFT or the like thus acquiring large brightness.

The organic EL layer is formed of a plurality of layers, and a thickness of each layer is extremely small. Further, properties of the organic EL layer are deteriorated by moisture and hence, wet etching cannot be used for forming the organic EL layer. Accordingly, conventionally, the organic EL layer is formed by a vacuum vapor deposition method. Further, for forming a color image, the organic EL layers are formed by using materials for forming light emitting layers which differ in color by vapor deposition using a mask. However, in view of the accuracy of the mask per se, the alignment accuracy between the mask and a substrate, the thermal expansion difference between the mask and the substrate or the like, the vapor-deposition position accuracy is insufficient so that the manufacture of a display with high accuracy has been difficult.

Large-sizing of a substrate is extremely effective for enhancing the production efficiency. However, a high-definition mask corresponding to the large-sized substrate increases a weight thereof due to a frame which imparts a tension to the mask for preventing sagging of the mask and hence, handling of the mask is difficult. In spite of an expensive unit price of the mask, when continuous vapor deposition is performed using one mask, films are stacked so that mask accuracy is lost whereby it is necessary to perform cleaning each time a cumulative film thickness reaches several μm. In the actual mass production of the organic EL display devices, it is necessary to prepare a considerably large number of masks. A high vacuum device of $10^{-4}$ Pa is necessary as a vacuum vapor deposition device so that the vacuum vapor deposition device is expensive as a mass production facility. In addition to these drawbacks, in the vapor deposition, only several % of an evaporated material is deposited on a surface of the substrate leading to a wasteful use of an expensive OLED material.

As a method which can obviate these drawbacks, a laser transfer method has been proposed. In the laser transfer method, however, laser beams are radiated to a transfer substrate from a backside and a film pattern is formed on a surface opposite to the back surface and hence, the whole pattern is drawn by laser beams on the large-sized substrate thus giving rise to a drawback that a manufacturing time is prolonged. Further, considerably high pattern drawing accuracy is requested so that a stage formed with high accuracy is necessary and hence, a cost for manufacturing the device is not largely lowered although the vapor deposition is not adopted. As documents which describe such a transfer method, JP-A-9-167684 (patent document 1) and JP-A-2006-309994 (patent document 2) are named.

SUMMARY OF THE INVENTION

Patent document 1 discloses the following technique. That is, a donor substrate includes a preliminarily pattered light absorption layer. Next, a desired organic EL material layer is uniformly applied to the patterned donor substrate by coating. The donor substrate and the EL substrate are held in a state that these substrates are arranged extremely close to each other, and these substrates are accurately aligned with each other by a proper means. The transfer for every pattern is achieved by preferably exposing the donor substrate to a strong blanket light source which is absorbed by patterned absorption layers formed on the donor substrate.

However, the technique described in patent document 1 has a drawback that the mere patterning of the light absorption layers cannot prevent light from impinging on the organic EL material layer so that the organic EL material layer is degenerated due to light energy thus making the reuse of the organic EL material layer impossible. Further, a temperature of the organic EL material layer is also increased so that a trivial amount of organic EL material layer is sublimated thus causing color mixing whereby drawbacks such as the abnormality of color of emitted light, lowering of light emitting efficiency and shortened lifetime occur.

Patent document 2 describes the following technique. That is, a donor substrate includes non-patterned light absorption layers. A desired organic EL material layer is uniformly applied to the donor substrate by coating. The donor substrate and an EL substrate are held in a state that these substrates are arranged extremely close to each other, and these substrates are aligned with each other accurately by a proper means. The transfer of an EL medium for every pattern from a donor to the EL substrate by sublimation is performed by drawing the EL medium on the donor absorption layers using laser beams or strongly focused beams such as a localized heat element. In this manner, a multi-colored organic EL material layer formed by patterning using a stacking method which arranges layers in a near-spaced-apart manner can be simply formed by repeating a transfer process which uses donor substrates having different organic EL material layers which are properly colored several times.

However, the technique disclosed in patent document 2 has a drawback that the technique requires an optical system of high accuracy for radiating light in a pattern or a stage of high accuracy for drawing the pattern using laser beams and hence, the technique is expensive.

Further, in the manufacture of the OLED, an OLED material is formed on an element substrate by vapor deposition using a mask, upper electrodes are formed and, thereafter, the element substrate is sealed. However, when foreign substances are present on the element substrate, defects are formed in a vapor-deposited film so that upper and lower electrodes are short-circuited thus giving rise to a drawback that non-lit pixels are liable to be generated. However, these documents neither describe nor suggest such a drawback and hence, these documents also fail to disclose means to cope with such a drawback.

It is an object of the present invention to provide an organic EL display device and a manufacturing method thereof which can overcome the above-mentioned drawbacks of the related art, can effectively perform the transfer of an organic EL layer, and can eliminate short-circuiting between a lower electrode and an upper electrode attributed to foreign substances in an organic EL layer.

To overcome the above-mentioned drawbacks, the present invention provides the following specific means.

(1) According to one aspect of the present invention, there is provided an organic EL display device having pixels each of which is formed by stacking a lower electrode, an organic EL layer and an upper electrode in such order in a region surrounded by a bank, wherein assuming a thickness of the organic EL layer stacked on the lower electrode as "a" and a thickness of an organic EL layer stacked on a side wall of the bank as "b", a region which satisfies a relationship of $0.9a \leqq b$ is defined on the side wall of the bank.

(2) In the organic EL display device having the constitution (1), the region which satisfies the relationship of $0.9a \leqq b$ is defined at a portion of the side wall of the bank closer to the lower electrode and having a height less than half of a height of the bank.

(3) According to another aspect of the present invention, there is provided an organic EL display device having pixels each of which is formed by stacking a lower electrode, an organic EL layer and an upper electrode in such order in a region surrounded by a bank, wherein assuming a maximum thickness out of a thickness of the organic EL layer stacked on the lower electrode as "a" and a maximum thickness out of a thickness of an organic EL layer stacked on a side wall of the bank as "b", a region which satisfies a relationship of $0.9a \leqq b$ is defined on the side wall of the bank.

(4) In the organic EL display device having the constitution (3), the region which satisfies the relationship of $0.9a \leqq b$ is defined at a portion of the side wall of the bank closer to the lower electrode and having a height less than half of a height of the bank.

(5) According to still another aspect of the present invention, there is provided a manufacturing method of an organic EL display device which includes an element substrate on which pixels each of which is formed by stacking a lower electrode, an organic EL layer and an upper electrode in a region surrounded by a bank in such order are formed in a matrix array, the manufacturing method comprising the steps of: arranging a donor substrate which is formed by forming a patterned light reflection layer on a substrate, forming a light absorption layer on the light reflection layer and forming an organic EL material layer on the light absorption layer in a state that the donor substrate faces the element substrate in an opposed manner: and forming an organic EL layer on said each pixel which is formed on the element substrate by radiating light to the donor substrate thus evaporating the organic EL material layer.

(6) In the manufacturing method of an organic EL display device having the constitution (5), the organic EL layer is formed of a plurality of layers, and out of the organic EL layer, a light emission layer and an electron transport layer are formed by evaporating an organic EL material layer for forming the light emitting layer, and the electron transport layer is formed by evaporating an organic EL material layer for forming the electron transport layer.

(7) In the manufacturing method of an organic EL display device having the constitution (6), out of the organic EL layer, a hole transport layer is formed by evaporating an organic EL material layer for forming the hole transport layer.

(8) In the manufacturing method of an organic EL display device having the constitution (5), the light is a light from a flash lamp.

(9) In the manufacturing method of an organic EL display device having the constitution (5), a surface protective film is formed on the light absorption layer.

(10) According to still another aspect of the present invention, there is provided a manufacturing method of an organic EL display device which includes an element substrate on which pixels each of which is formed by stacking a lower electrode, an organic EL layer and an upper electrode in a region surrounded by a bank in such order are formed in a matrix array, the manufacturing method comprising the steps of: arranging a donor substrate which is formed by forming a patterned light absorption layer on the substrate, by forming light reflection layers on the light absorption layer, and by forming an organic EL material layer on the light reflection layer in a state that the donor substrate faces the element substrate in an opposed manner: and forming an organic EL layer on said each pixel which is formed on the element substrate by radiating light to the donor substrate thus evaporating the organic EL material layer.

(11) In the manufacturing method of an organic EL display device having the constitution (10), the organic EL layer is formed of a plurality of layers, and out of the organic EL layer, a light emission layer and an electron transport layer are formed by evaporating an organic EL material layer for forming the light emitting layer, and the electron transport layer is formed by evaporating an organic EL material layer for forming the electron transport layer.

(12) In the manufacturing method of an organic EL display device having the constitution (11), out of the organic EL layer, a hole transport layer is formed by evaporating an organic EL material layer for forming the hole transport layer.

(13) In the manufacturing method of an organic EL display device having the constitution (10), the light is a light from a flash lamp.

(14) In the manufacturing method of an organic EL display device having the constitution (10), a surface protective film is formed on the light reflection layer.

In the method for forming the organic EL layer by transferring the organic EL material layer from the donor substrate, by patterning the light reflection layers of the donor substrate, it is possible to evaporate only the organic EL material layer at necessary portions. Accordingly, it is unnecessary to use a light source having sharp focusing and hence, it is possible to realize the transfer of the organic EL layer without using an expensive optical system.

Further, out of the organic EL material layer of the donor substrate, the temperature elevation of portions of the organic EL material layer which are not evaporated is small and hence, there is no possibility that the portions are degenerated whereby these portions can be collected and reused. Accordingly, a material cost of the organic EL layer material can be saved.

Further, the transfer of the organic EL layer of the present invention is performed within a range from 10 kPa to atmospheric pressure so that a mean free path of evaporated particles is small and hence, the directivity of the evaporated particles is small whereby even when a foreign substance or the like exists on the lower electrode, side surfaces or the like of the foreign substance can be also covered with the organic EL layer. Accordingly, it is possible to prevent short-circuiting between the lower electrode and the upper electrode.

The above-mentioned advantageous effects can also be obtained by using the donor substrate which is formed by patterning the light absorption layer in the same manner.

DESCRIPTION OF THE PREFERRED EMBODIMENTS

Figure 1:
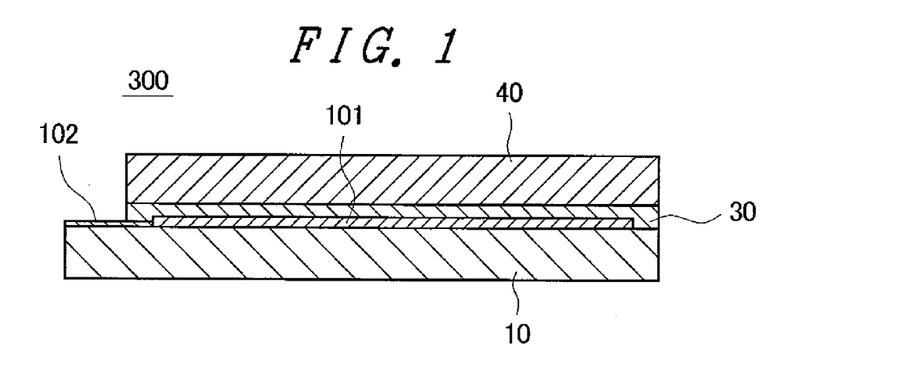
FIG. 1 is a cross-sectional view of an organic EL display device of the present invention.

Prior to the explanation of specific embodiments of the present invention, the constitution of an organic EL display device to which the present invention is applied is explained. FIG. 1 is a cross-sectional view of an organic EL display panel 300 which constitutes the organic EL display device of the present invention. In FIG. 1, a display region 101 is formed on an element substrate 10. In the display region 101, organic EL layers for forming an image and thin film transistors (TFT) and the like for driving the organic EL layers are formed in a matrix array.

An adhesive material sheet 30 which also plays a role of sealing is mounted on the organic EL display panel 300 in a state that the adhesive material sheet 30 covers the display region 101. A sealing substrate made of glass is adhered to the element substrate by this adhesive material sheet. The adhesive material sheet 30 may be formed using a thermosetting epoxy resin. A thickness of the adhesive material is 10 μm to 20 μm, the material of the adhesive material sheet 30 is not limited to an epoxy resin, and the adhesive material sheet 30 may be made of an acrylic resin or a silicon resin.

Although the adhesive material sheet 30 may preferably be non-moisture-permeable, the adhesive material sheet 30 may not be always made of a material which exhibits strong barrier property against moisture. This is because the barrier property against moisture is mainly provided by a sealing substrate 40 which is made of glass. That is, provided that the organic EL display device has the constitution shown in FIG. 1, the intrusion of moisture from above can be blocked by the sealing substrate 40 made of glass, and it is necessary for moisture which enters the organic EL display device from aside portion of the organic EL display device to pass along distance before arriving at the organic EL layer.

A terminal portion 102 for supplying electricity, video signals and the like to the organic EL layers in the display region 101 extends over an edge portion of the element substrate 10. Although the terminal portion 102 is not covered with an adhesive material, lines are covered with an inorganic passivation film or an organic passivation film and hence, there is no possibility that an conductive film of the terminal portion 102 is corroded. Further, the conductive film is not influenced by moisture to an extent that the organic EL layer is influenced by moisture.

FIG. 1 shows the so-called solid sealing structure where no space is formed between the sealing substrate 40 and the element substrate 10. Accordingly, different from the hollow sealing structure, a drawback that the sealing substrate 40 comes into contact with the element substrate 10 when the sealing substrate 40 is pushed so that black spots are generated does not arise in this embodiment. Further, various drawbacks attributed to an internal pressure of a sealing gas when the organic EL display device is sealed do not also arise.

Figure 2:
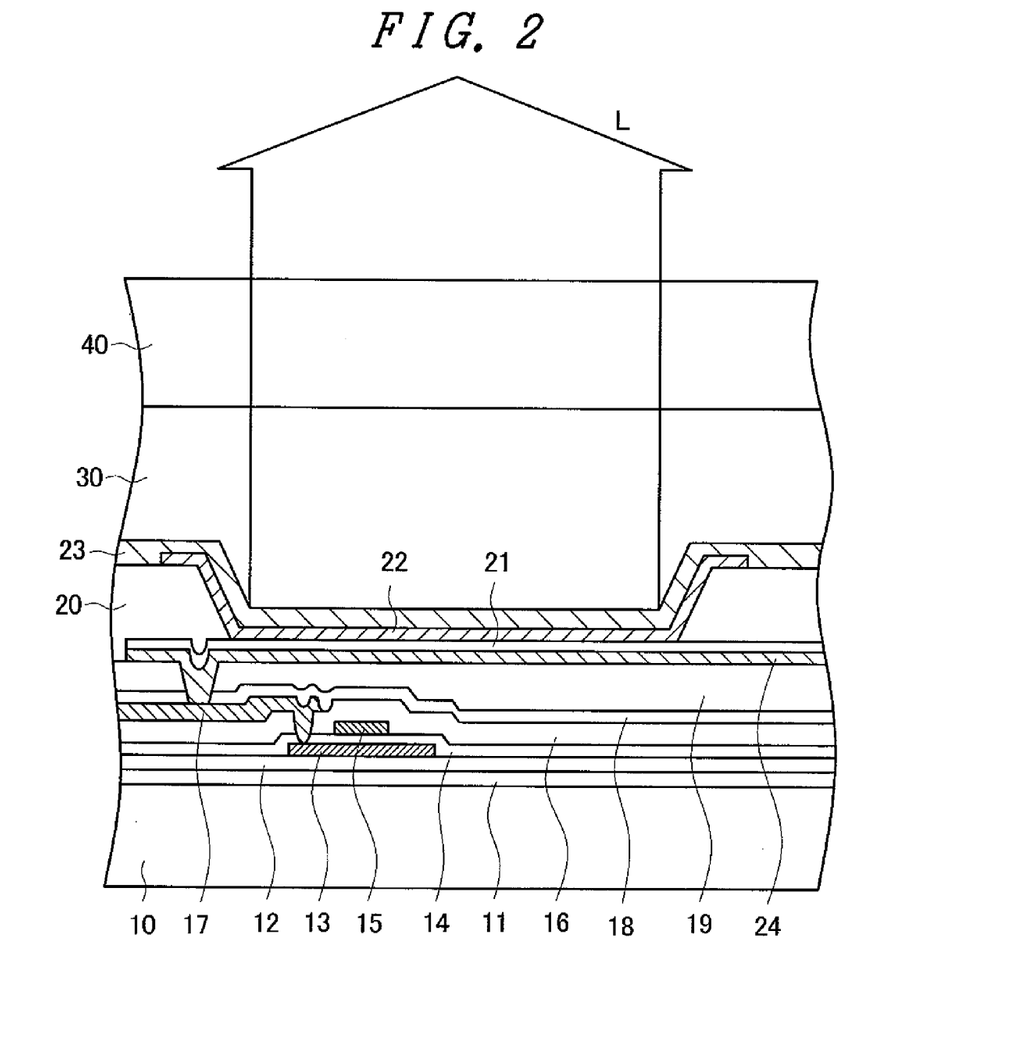
FIG. 2 is a cross-sectional view of a top-emission-type organic EL display device.

FIG. 2 is a cross-sectional view of a pixel portion of a top-emission-type organic EL display device. Hereinafter, although the cross-sectional structure of the pixel portion is explained by taking the top-emission-type organic EL display device as an example, the present invention is also applicable to a bottom-emission type organic EL display device. The top-emission-type organic EL display device can be classified into a top-anode-type organic EL display device in which an anode is arranged above an organic EL layer 22 and a top-cathode-type organic EL display device in which a cathode is arranged above an organic EL layer 22. Although FIG. 2 shows the top-cathode type organic EL display device, the present invention is also applicable to the top-anode type organic EL display device in the same manner.

As shown in FIG. 2, a first background film 11 made of SiN and a second background film 12 made of $SiO_2$ are formed on an element substrate 10. These background films 11, 12 are provided for preventing impurities from a glass substrate from contaminating a semiconductor layer 13. The semiconductor layer 13 is formed on the second background film 12. In forming the semiconductor layer 13, an a-Si film is formed by a CVD method and, thereafter, the a-Si film is transformed into a poly-Si film by radiating laser beams to the a-Si film.

A gate insulation film 14 made of $SiO_2$ is formed so as to cover the semiconductor layer 13. A gate electrode 15 is formed in a state that the gate electrode 15 faces the semiconductor layer 13 in an opposed manner with the gate insulation film 14 sandwiched therebetween. Using the gate electrode 15 as a mask, the semiconductor layer 13 is doped with impurities such as phosphorus or boron by ion implantation so as to make the semiconductor layer 13 conductive thus forming a source portion or a drain portion in the semiconductor layer 13.

An interlayer insulation film 16 made of $SiO_2$ is formed so as to cover the gate electrode 15. The interlayer insulation film 16 is provided for ensuring the insulation between gate lines and drain electrodes 17. The drain electrode 17 is formed on the interlayer insulation film 16. The drain electrode 17 is connected to the drain portion of the semiconductor layer 13 via a through hole 65 formed in the interlayer insulation film 16 and the gate insulation film 14.

Thereafter, to protect a thin film transistor TFT, an inorganic passivation film 18 made of SiN is formed on the interlayer insulation film 16. An organic passivation film 19 is formed on the inorganic passivation film 18. The organic passivation film 19 plays a role of protecting the TFT more completely together with the inorganic passivation film 18. The organic passivation film 19 also plays a role of leveling a surface on which an organic EL layer 22 is formed. Accordingly, the organic passivation film 19 is formed with a large thickness of 1 to 4 μm. Hereinafter, the organic passivation film 19 may also be referred to as a leveling film 19.

A reflection electrode 24 made of Al or Al alloy is formed on the organic passivation film 19. Since Al or Al alloy exhibits high reflectance, Al or Al alloy is preferably used as a material of the reflection electrode 24. The reflection electrode 24 is connected to the drain electrode 17 via a through hole 65 formed in the organic passivation film 19 and the inorganic passivation film 18.

FIG. 2 shows the top-cathode-type organic EL display device and hence, a lower electrode 21 of the organic EL layer 22 constitutes an anode. Al or an Al alloy which is used for forming the reflection electrode 24 possesses a small work function and hence, Al or Al alloy is not appropriate as a material for forming the anode. Accordingly, a lower electrode 21 which constitutes an anode is formed on the reflection electrode 24 using ITO (Indium Tin Oxide). By annealing the ITO film after the formation of the ITO film by sputtering, it is possible to increase the conductivity of the ITO film.

The organic EL layer 22 is formed on the lower electrode 21. The organic EL layer 22 is formed of a plurality of layers. In this embodiment, the organic EL layer is formed by stacking a hole transport layer, a light emission layer, an electron transport layer and an electron injection layer in an ascending order from below. The upper electrode 23 which constitutes a cathode is formed on the organic EL layer 22. In the present invention, the upper electrode 23 is formed of a AgMg alloy film. The AgMg alloy film has a small thickness of approximately 10 nm for maintaining transparency thereof. In general, InZnO (Indium Zinc Oxide) is used as a material for forming the upper electrode 23. The InZnO film is formed over the whole display region 100 by vapor deposition without using a mask. A thickness of the InZnO film is set to approximately 30 nm for maintaining optical transmissivity.

The organic EL layer 22 is formed of a plurality of layers, and the constitution of the organic EL layer 22 is as follows. A material which can be used as an electron-transport-layer material is not particularly limited provided that the material exhibits electron transport property and can be easily formed into a charge-transfer complex by co-deposition with alkali metal and, for example, a metal complex such as tris (8-quinolinolato) aluminum, tris (4-methyl-8-quinolinolato) aluminum, bis (2-methyl-8-quinolinolato)-4-phenylphenolato-aluminum, bis [2-[2-hydroxyphenyl]benzooxazolato] zinc, 2-(4-biphenylyl)-5-(4-tert-butylphenyl)-1,3,4-oxadiazol, 1,3-bis[5-(p-tert-butylphenyl)-1,3,4-oxadiazol-2-yl] benzene or the like can be used.

The electron injection layer is formed by co-depositing a material which exhibits electron imparting property to a material used for forming the electron transport layer. The material which exhibits electron imparting property may be one selected from a group consisting of, for example, a metal group including alkaline metal such as lithium or cesium, alkaline earth metal such as magnesium or calcium and rare earth metal, and oxide, halide, carbonate or the like of the above-mentioned materials.

The hole transport layer may be made of, for example, a tetraaryl benzidine compound (triphenyl diamine: TPD), aromatic tertiary amine, a hydrazone derivative, a carbazole derivative, a triazole derivative, an imidazole derivative, an oxadiazole derivative having an amino group, a polythiophene derivative, a copper phthalocyanine derivative or the like.

A material which can be used as a light-emitting-layer material is not specifically limited provided that the material is made of a host material having an electron-and-hole transporting ability to which a dopant which emits fluorescence by re-coupling thereof is added and the material forms a light emitting layer by co-vapor-deposition. For example, as the host material, a complex such as tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolato lithium, tris(5-chloro-8-quinolinolato)gallium, bis(5-chloro-8-quinolinolato)calcium, 5,7-dichloro-8-quinolinolato aluminum, tris(5,7-dibromo-8-hydroxyquinolinolato)aluminum, and poly[zinc (II)-bis(8-hydroxy-5-quinolinyl)methane], an anthracene derivative, a carbazole derivative, or the like may be used.

Further, the dopant may be a material which captures electrons and holes in a host material and emits light by re-coupling them. For example, the red dopant may be formed of a pyran derivative, the green dopant may be formed of a coumarin derivative, and the blue dopant may be formed of a substance which emits fluorescent light such as an anthracene derivative or a substance which emits phosphorescence such as an iridium complex and a pyridinato derivative.

An uppermost layer may be formed of a transparent conductive film for taking out light. In this embodiment, a thin alloy film made of AgMg is used as the transparent conductive film. However, it may be possible to use other transparent conductive film made of InZnO or the like, for example, in view of the relationship between optical transmissivity and the electric resistance.

Here, to prevent the organic EL layer 22 from being broken at an edge portion thereof due to a broken step, a bank 20 is formed between the pixels. The bank 20 may be formed of an organic material, or the bank 20 may be formed of an inorganic material such as SiN. In forming the bank 20 using the organic material, in general, an acrylic resin or a polyimide resin is used.

The upper electrode 23 is formed over the whole display region 101 of the organic EL display device such as above the organic EL layers 22 and above the banks 20 by vapor deposition, sputtering or the like. A sealing substrate 40 made of glass is arranged above the upper electrode 23 with an adhesive material sheet 30 sandwiched therebetween. The organic EL layer 22 lowers the light emitting efficiency when the moisture is present in the organic EL layer 22. To prevent such lowering of the light emitting efficiency, the sealing substrate 40 is provided. The adhesive material sheet per se has a moisture preventing effect.

The content of the present invention is explained in detail in conjunction with embodiments hereinafter.

Embodiment 1

Figure 3:
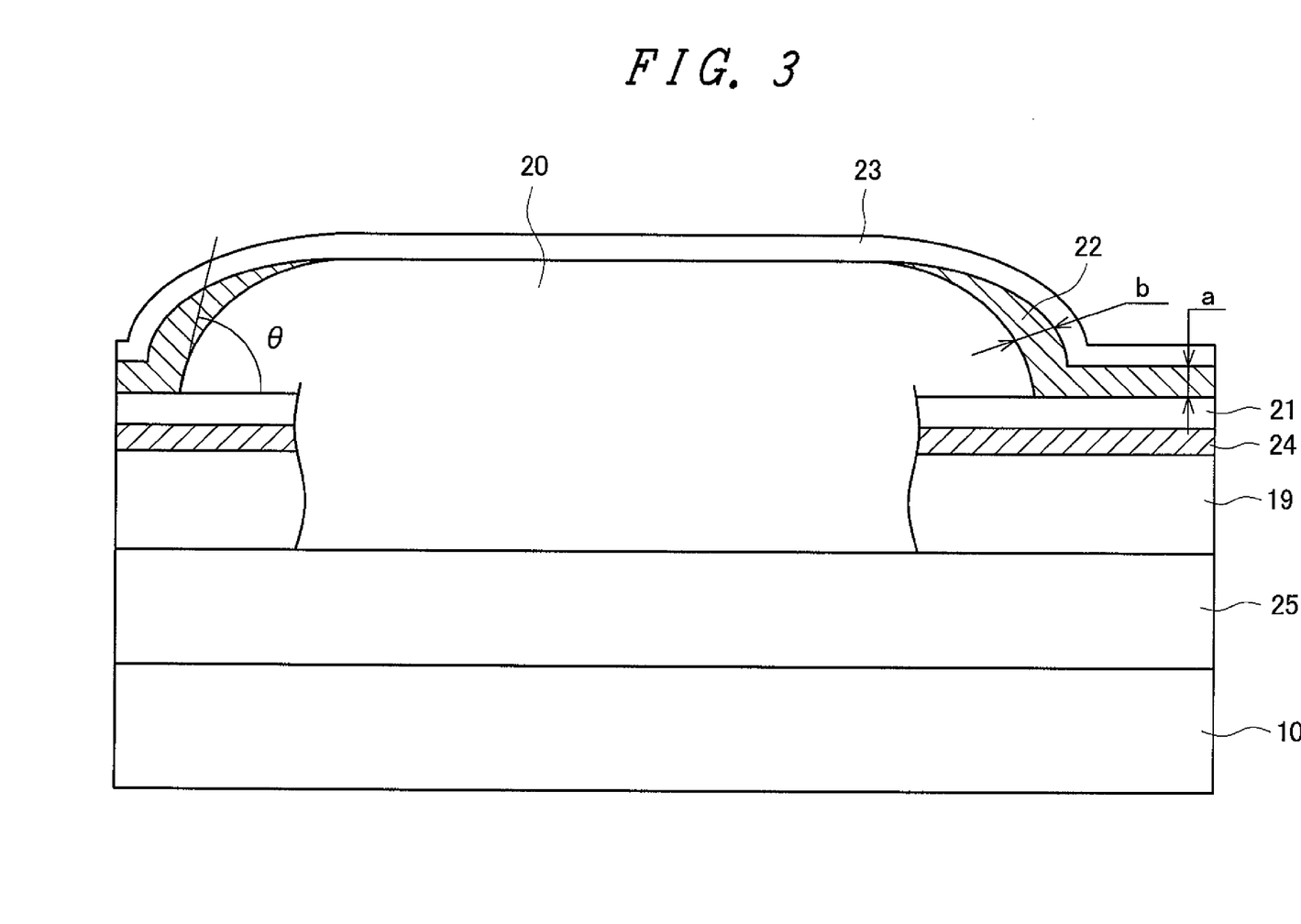
FIG. 3 is a detailed cross-sectional view of area in the vicinity of an organic EL layer of a pixel portion.

FIG. 3 is a cross-sectional view of a pixel portion, particularly an area of the pixel portion in the vicinity of the organic EL layer 22 according to the present invention. In the cross-section shown in FIG. 3, the detailed structure of the TFT and the like is omitted. In FIG. 3, the pixel including the organic EL layer 22 is formed on both sides of the bank 20. TFT regions 25 are formed on the element substrate 10. A leveling film 19 which also functions as an organic passivation film 19 is formed on the TFT regions 25. Reflective electrodes 24 are formed on the leveling film 19, and lower electrodes 21 are formed on the reflective electrodes 24 using ITO. Organic EL layers 22 are formed on the ITO film.

The organic EL layer 22 is formed of four layers consisting of a hole transport layer, a light emission layer, an electron transport layer and an electron injection layer. The hole transport layer, the light emission layer and the electron transport layer are formed by the transfer method of the present invention explained later, and the electron injection layer is formed by vapor deposition. In FIG. 3, the organic EL layers 22 excluding the electron injection layer is formed by the transfer according to the present invention, and the organic EL layer 22 is also applied to a side wall of the bank 20.

An upper electrode 23 is formed by vapor deposition so as to cover the organic EL layer 22. The upper electrode 23 is not formed by vapor deposition using a mask for every pixel but is formed by vapor deposition such that front surfaces of the organic EL layer 22 are covered with the upper electrode 23 in a matted manner. In the same manner as the upper electrode 23, the electron injection layer is also formed by vapor deposition in a matted manner. However, a thickness of the electron injection layer is extremely small, that is, 0.7 nm and hence, the structure shown in FIG. 3 is described ignoring the thickness of the electron injection layer.

In FIG. 3, film thicknesses of the respective layers are set as follows, for example. The reflective electrode 24 made of Al has a thickness of 200 nm, the lower electrode 21 made of ITO has a thickness of 77 nm, the hole transport layer has a thickness of 77 nm, the light emission layer has a thickness of 60 nm, the electron transport layer has a thickness of 10 nm, and the electron injection layer has a thickness of 0.7 nm, and the upper electrode 23 made of an AgMg alloy has a thickness of 10 nm.

Figure 4:
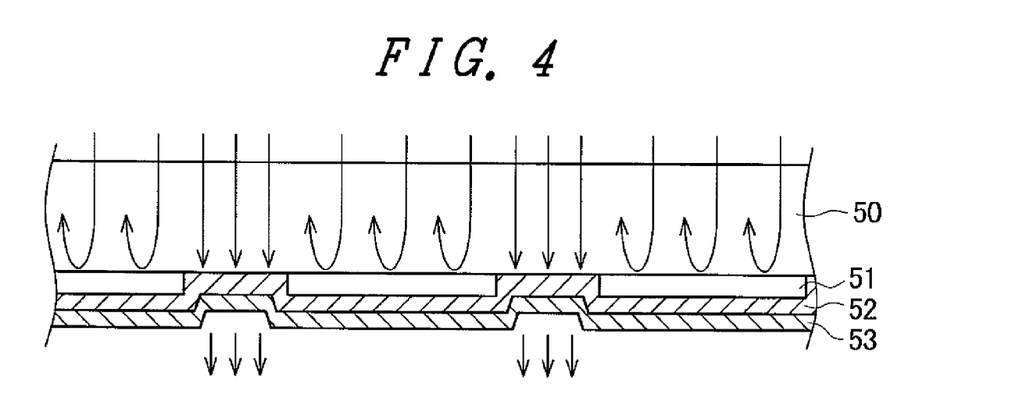
FIG. 4 is a cross-sectional view of a donor substrate according to an embodiment 1.

Next, a method for forming the organic EL layer 22 shown in FIG. 3 by the transfer according to the present invention is explained. FIG. 4 is a cross-sectional view of the donor substrate 50 used in the present invention. The donor substrate 50 may preferably be made of a material having the substantially equal thermal expansion coefficient as the element substrate 10. In this embodiment, the donor substrate 50 is formed of a glass sheet made of the same material as the element substrate 10.

In FIG. 4, the pattered light reflection layer 51 is formed on the donor substrate 50, it is necessary to form the light reflection layer 51 using a material having high reflectance and hence, the light reflection layer 51 is formed using Al, an Al alloy, silver or a silver alloy. A reflective film may be formed by sputtering, vapor deposition, plating or the like. Patterning may be performed using usual photolithography.

The light absorption layer 52 is formed by sputtering so as to cover the light reflection layer 51. As a material of the light absorption layer 52, it is desirable to use a material which has a high melting point and low reflectance such as Mo, Cr, Ti or W. The light absorption layer 52 may be formed of an alloy of such metal and Fe, Ni or the like. The light absorption layer 52 may be formed of an oxide of such metals. Further, the light absorption layer 52 may be formed by stacking an oxide of Cr and Cr. Here, oxide of Cr is firstly formed on a donor substrate 50 side, and Cr is stacked on oxide of Cr. It is unnecessary to apply patterning to the light absorption layer 52 in FIG. 4.

On the light absorption layer 52, an organic EL material layer 53 for forming the organic EL layers 22 to be transferred is formed. In FIG. 4, a hole transport layer material is formed as the organic EL material layer 53, for example. In such a state, light is radiated from a back surface of the donor substrate 50 as indicated by an arrow. Light is reflected on portions of the donor substrate 50 where the light reflection layers 51 are formed and hence, the light absorption layer 52 formed on the light reflection layers 51 are not heated. Accordingly, the organic EL material layer 53 stacked on these portions is not heated and evaporated.

On the other hand, light is radiated to the light absorption layer 52 at portions of the donor substrate 50 where the light reflection layers 51 are not present and hence, the light absorption layer 52 generates heat. Accordingly, the organic EL material layer 53 is simultaneously heated and evaporated. A manner that the organic EL material layer 53 is evaporated is indicated by a dotted arrow. By arranging the element substrate 10 in the direction that the organic EL material layer 53 is evaporated, the organic EL material layer 53 is transferred to the element substrate 10.

In transporting the hole transport layer, the organic EL material layer 53 shown in FIG. 4 is made of a hole transport layer material. In transporting the light emission layer, the organic EL material layer 53 shown in FIG. 4 is made of a light emission layer material. In transporting the electron transport layer, the organic EL material layer 53 shown in FIG. 4 is made of an electron transport layer material. Since light emission layers are constituted of the light emission layers in three colors and hence, it is necessary to transfer the organic EL material layer 53 corresponding to respective three colors.

Figure 5:
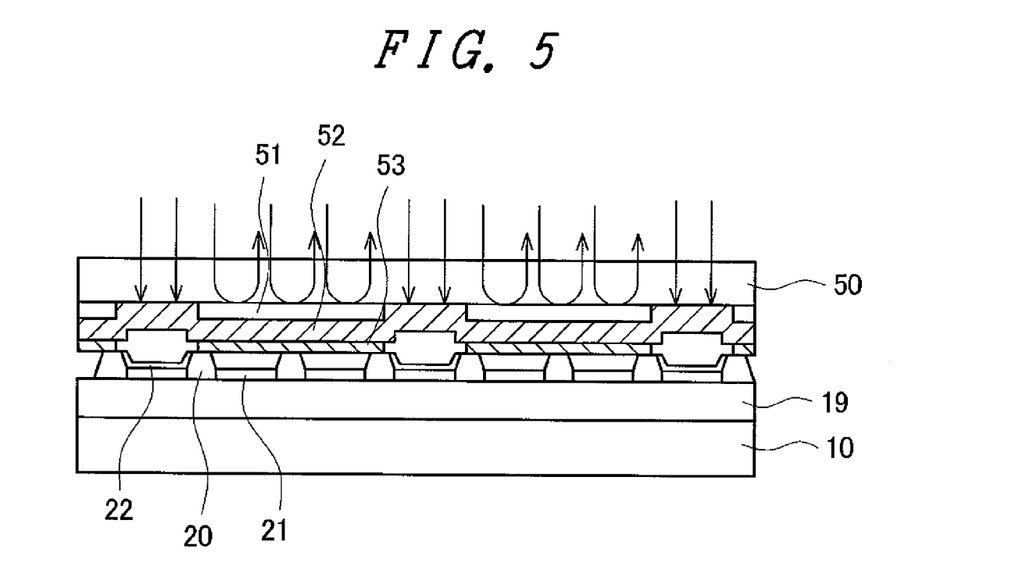
FIG. 5 is a cross-sectional view showing a state where the organic EL layer is transferred to an element substrate from the donor substrate according to the embodiment.

FIG. 5 is a cross-sectional view showing a state where the organic EL layers 22 are transferred to the element substrate 10. With respect to the structure shown in FIG. 5, as explained in conjunction with FIG. 4, the light reflection layer 51 is formed on the donor substrate 50, the light absorption layer 52 is formed on the light reflection layer 51, and the organic EL material layer 53 is formed on the light absorption layer 52. In FIG. 5, the element substrate 10 is arranged to face the donor substrate 50 in an opposed manner. In FIG. 5, the element substrate 10 is described in a simplified manner. The lower electrodes 21 are formed on the leveling film 19 formed on the element substrate 10.

The pixels are defined by the bank 20 sandwiched between the pixels. A cavity is formed in a region surrounded by the bank 20 and the donor substrate 50, and the organic EL material layer 53 to be transferred is evaporated in the cavity. In FIG. 5, the organic EL material layer 53 on the donor substrate 50 is heated by the light absorption layer 52, the vaporized organic EL material layer 53 moves in the cavity, and the organic EL layer 22 is formed on the lower electrode 21 formed on the element substrate 10.

As shown in FIG. 5, in the present invention, the organic EL material layer 53 is heated and evaporated only at portions where the light reflection layer 51 is not formed. Since portions of the organic EL material layer 53 where the light reflection layers 51 are formed are not heated, there is no possibility that the organic EL material layer is degenerated. As shown in FIG. 5, a portion of the organic EL material layer 53 is transferred to the element substrate 10, and most of the organic EL material layer 53 remains on the donor substrate 50. Since the organic EL material layer 53 is expensive, by collecting and using the organic EL material layer 53 after transfer, it is possible to lower a manufacturing cost of the organic EL display device.

Further, in the present invention, with the use of the light reflection layers 51, it is possible to distinctly separate the organic EL material layer 53 into portions to be heated and portions not to be heated thus enhancing contrast in forming a pattern by the transfer.

In this manner, according to the present invention, it is possible to acquire high pattern accuracy without forming the organic EL layers in vacuum. However, to achieve the further enhancement of pattern accuracy, a pressure in a space defined between the bank 20 formed on the element substrate 10 and the donor substrate 50 is reduced so as to bring the banks 20 formed on the element substrate 10 and the donor substrate 50 into close contact with each other thus pressurizing the organic EL display device from a donor substrate 50 side. Due to such reduction of pressure, the sublimated material is confined in a region surrounded by upper and lower substrates and the banks 20 thus realizing extremely high pattern accuracy.

Even when the reduction of pressure is made, the high degree of vacuum is not desirable. By setting the pressure after pressure reduction to not less than 10 kPa, a mean free path becomes not more than 1 μm and hence, it is possible to acquire extremely favorable film follow-up property. A speed at which molecules jump from the donor substrate 50 is also one of factors which decide film follow-up property, wherein the greater the speed, film follow-up property is worsened.

Figure 7:
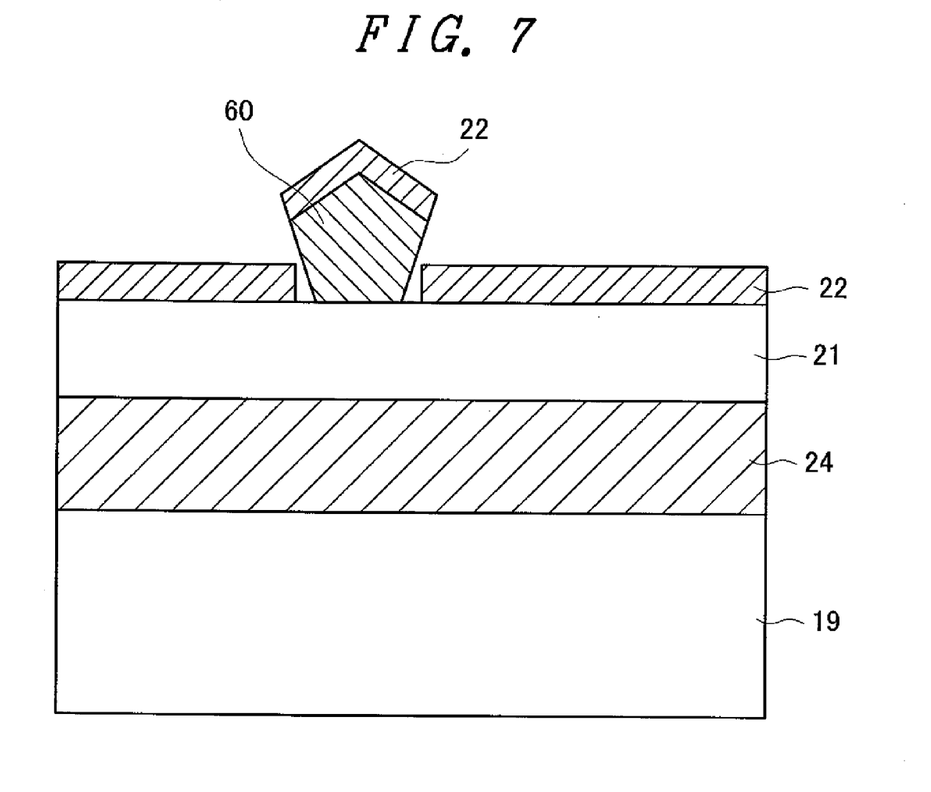
FIG. 7 is a cross-sectional view showing an example where a foreign substance exists in a lower electrode in the related art.

In the general laser transfer or the like, to sublimate a material with high energy density, a speed of molecules is increased and directivity is also high and hence, film follow-up property is not so favorable. When film follow-up property is not so favorable, an angle made by the bank and the lower electrode, that is, a so-called taper angle is set to not more than 45° so as to prevent a film thickness of a side wall of the bank from becoming small. When the taper angle is set to such a value, however, it is necessary to increase a width of the bank by an amount corresponding to a tapered portion of a side surface of the bank so that an area of the light emitting portion is decreased. Accordingly, in the case of a display device of high definition, a taper angle of the bank is set to not less than 60° so as to decrease an area of the bank. However, when film follow-up property is not favorable in such a case, possibility that the upper electrode and the lower electrode are short circuited in a boundary portion between the bank and the lower electrode is increased. Further, another case where film follow-up property causes a drawback is a case where a foreign substance 60 exists on the lower electrode 21. FIG. 7 shows the manner how a film is adhered when the organic EL layer 22 is transferred using the general laser transfer or the like in such a case where the foreign substance 60 exists on the lower electrode 21.

In FIG. 7, the organic EL material layer 53 jumps from above with high directivity and hence, the organic EL layer 22 is not formed below the foreign substance 60. When the upper electrode 23 is formed by vapor deposition in such a state, the lower electrode 21 and the upper electrode 23 are brought into contact with each other at the portion which is not covered with the organic EL layer 22 so that the pixel becomes defective.

Figure 6:
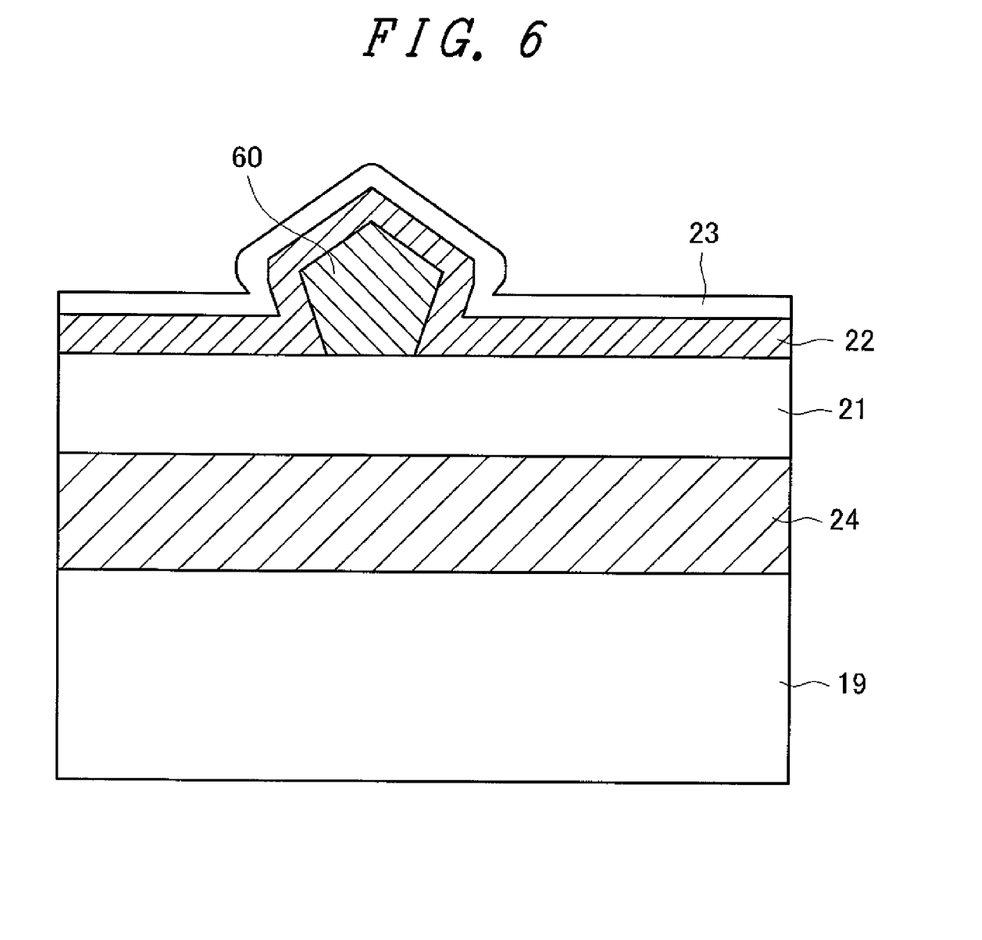
FIG. 6 is a cross-sectional view showing an example where a foreign substance exists in a lower electrode in a transfer method of the present invention.

On the other hand, according to the transfer of the present invention, a mean free path of evaporated molecules is short and, at the same time, energy of the evaporated molecules is not so high compared to a case where the laser transfer is adopted and hence, film follow-up property of the organic EL layer 22 is extremely enhanced. FIG. 6 is a schematic view showing film follow-up property of the organic EL layer 22 when the transfer according to the present invention is performed in a case where the foreign substance 60 exists above the lower electrode 21. In FIG. 6, the organic EL layer 22 is also formed on a side surface of the foreign substance 60 and a lower portion of the foreign substance 60.

Even when the upper electrode 23 is formed in such a state, a periphery of the foreign substance 60 is surrounded by the organic EL layer 22 and hence, there is no possibility that the upper electrode 23 and the lower electrode 21 are short circuited with each other. Accordingly, the present invention can reduce the number of defective pixels caused by short circuiting of the upper electrode 23 and the lower electrode 21.

According to the transfer method of the present invention, film follow-up property is enhanced and hence, the formation of the organic EL layer 22 on the lower electrode 21 and the side wall of the bank 20 becomes different from the corresponding adhesion of the organic EL layer 22 by a conventional vacuum vapor deposition method. In the conventional example, irrespective of the vapor deposition method or the transfer using the laser beams, although a necessary amount of the organic EL layer 22 is stacked on an upper portion of the lower electrode 21, when a taper angle of the bank is set to θ, the organic EL layer 22 having only a film thickness obtained by multiplying a film thickness of the lower electrode by $\cos\theta$ is formed on the side wall of the bank 20. To the contrary, according to the transfer method of the present invention, due to the favorable film follow-up property of the organic EL layer 22, an amount of the organic EL layer 22 substantially equal to an amount of the organic EL layer 22 which is stacked on the upper portion of the lower electrode 21 is formed also on the side wall of the bank 20, particularly, on a portion of the side wall close to the lower electrode 21 irrespective of a taper angle of the bank.

According to the transfer method of the present invention, in FIG. 3, assuming a thickness of the organic EL layer 22 on the upper portion of the lower electrode 21 as "a", and the thickness of the organic EL layer 22 on the side wall of the bank 20, particularly, on the portion of the side wall close to the lower electrode 21 as "b", the relationship of $0.9a \leq b$ is established. Further, when the film thickness on the upper portion of the lower electrode 21 has a distribution, the thickness of the organic EL layer 22 at a portion which has the largest film thickness of the lower electrode 21 is taken as a value of "a", and a film thickness of the organic EL layer 22 at a portion having the largest film thickness on the side wall of the bank 20 is taken as a value of "b".

Further technical feature of the present invention lies in that a temperature of portions of the organic EL material layer 53 formed below the light reflection layers 51 is not increased and hence, these portions are degenerated. Accordingly, after transferring the organic EL material layer 53 to pixel portions on the element substrate 10 which require the organic EL material, it is possible to collect and reuse the organic EL material layer 53 remaining on the donor substrate 50. Since the organic EL material layer 53 is expensive, the collection and the reuse of the organic EL material layer 53 is largely advantageous for the reduction of a manufacturing cost of the organic EL display device.

Embodiment 2

As explained in conjunction with the embodiment 1, the donor substrate 50 has the patterned light reflection layers 51 and the patterned light absorption layer 52, and the organic EL material layer 53 is formed on the light reflection layers 51 and the light absorption layer 52. After transferring the organic EL material layer 53 to the element substrate 10, the organic EL material layer 53 is collected and reused. After collecting the organic EL material layer 53, it is desirable to reuse the donor substrate 50 having the light reflection layers 51 and the light absorption layer 52. However, as explained in conjunction with the embodiment 1, the light absorption layer 52 is made of metal and hence, there exists a large possibility that a surface of the organic EL material layer 53 after collection is contaminated or damaged.

Figure 8:
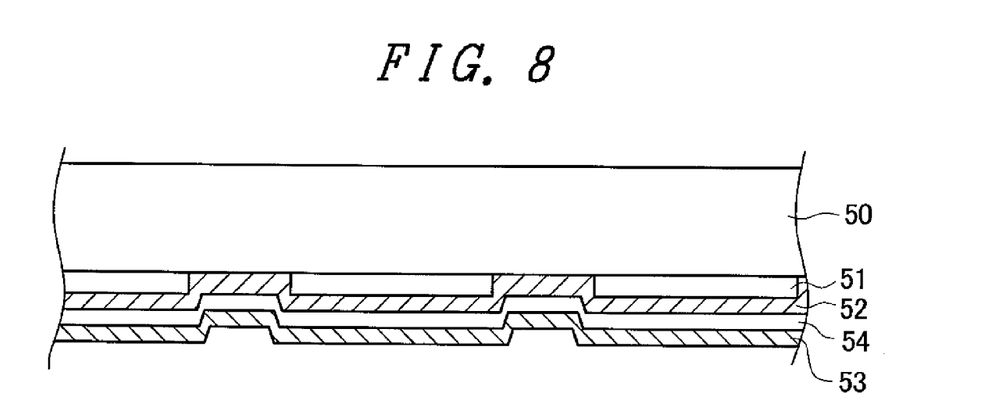
FIG. 8 is a cross-sectional view of a donor substrate of an embodiment 2.

To overcome this drawback, in this embodiment, as shown in FIG. 8, a surface protective film 54 is formed on the light absorption layer 52, and the organic EL material layer 53 is formed on the surface protective film 54. In this embodiment, the surface protective film 54 is made of SiN. SiN is chemically stable and, at the same time, possesses heat conductivity sufficient to transmit heat generated by the light absorption layer 52 to the organic EL material layer 53.

In this manner, by forming the surface protective film 54 using SiN, the light absorption layer 52 and the light reflection layers 51 which are formed below the SiN film are protected and hence, it is possible to repeatedly use the donor substrate 50 even after the organic EL material layer 53 is transferred and collected. Accordingly, it is possible to reduce a manufacturing cost of the organic EL display device.

The surface protective film 54 may be formed using ITO or InZnO besides SiN. ITO, InZnO or the like is metal oxide and is chemically stable. Further, ITO and InZnO have conductivity and hence, these metals have an advantage that it is possible to prevent a surface of the donor substrate 50 from being charged. Further, ITO, InZnO or the like is used as a material for forming the lower electrodes 21 or the upper electrodes 23 of the organic EL display device and hence, these metals also have an advantage that it is unnecessary to increase kinds of materials to be used.

Embodiment 3

Figure 9:
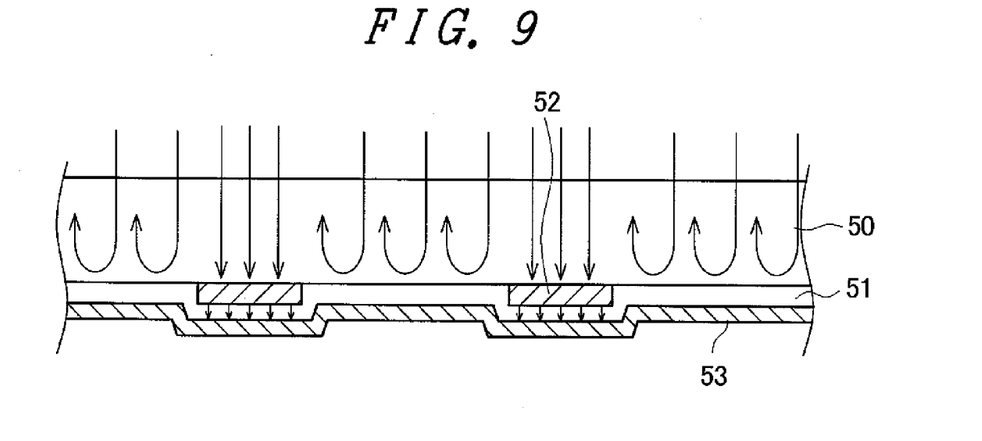
FIG. 9 is a cross-sectional view of a donor substrate of an embodiment 3.

An embodiment shown in FIG. 9 describes a case where the order of forming a light reflection layer 51 and light absorption layers 52 is exchanged compared with the case described in the embodiment 1. In FIG. 9, the patterned light absorption layers 52 are formed on the donor substrate 50. In the same manner as the embodiment 1, the light absorption layers 52 are applied to the donor substrate 50 by sputtering or the like and, thereafter, the light absorption layers 52 are patterned by a photolithography step. As a material of the light absorption layers 52, in the same manner as the embodiment 1, a material such as Mo, Cr, Ti or W having a high melting point and low reflectance is used. Alternatively, an alloy of these metals with Fe, Ni or the like is used as the material of the light absorption layers 52. Further, oxides of these metals may be also used. Still further, the light absorption layer 52 may be a stacked film consisting of a Cr oxide layer and a Cr layer. In this case, a Cr oxide layer is firstly formed on a donor substrate 50 side, and the Cr layer is stacked on the Cr oxide layer.

The patterned light reflection layer 51 is formed on the light absorption layers 52. As a material of the light reflection layer 51, a material having high reflectance is used in the same manner as the embodiment 1. That is, Al, an Al alloy, silver or a silver alloy is used. The light reflection layer 51 may be formed by sputtering, vapor deposition, plating or the like. In this embodiment, it is unnecessary to form the light reflection layer 51 by patterning. An organic EL material layer 53 is formed on the light reflection layer 51.

As shown in FIG. 9, when light is radiated to the donor substrate 50 formed in such a manner from a back side of the donor substrate 50, as indicated by arrows in FIG. 9, light is absorbed by the light absorption layers 52, and the light is radiated on portions where the light reflection layer 51 is formed. The light absorption layers 52 absorb light so that a temperature of the light absorption layer 52 is elevated. This heat is transmitted to the light reflection layer 51 as indicated by an arrow so that the organic EL material layer 53 is heated. Due to such heating of the organic EL material layer 53, the organic EL material layer 53 is evaporated, and the evaporated organic EL material layer 53 is adhered to pixel portions of element substrate 10 not shown in FIG. 9. The manner how the organic EL material layer 53 is transferred to the pixel portions on the element substrate 10 is substantially equal to the manner of transfer of the organic EL material layer 53 explained in conjunction with FIG. 5.

On the other hand, in FIG. 9, at portions of the donor substrate 50 where the light absorption layers 52 are not formed, light is reflected on the light reflection layer 51 and hence, the organic EL material layer 53 stacked on such portions is neither heated nor evaporated. Further, the organic EL material layer 53 formed in such portions is not heated and hence, the organic EL material layer 53 is not degenerated also whereby the organic EL material layer 53 can be reused after a transfer step. In this manner, this embodiment can also acquire the substantially equal advantageous effects as the advantageous effects explained in conjunction with the embodiment 1.

However, in this embodiment, the transferred pattern of the light absorption layer is wider than the transferred pattern of the embodiment 1 by 2 to 4 µm and hence, the transfer accuracy of the embodiment 1 is higher than the transfer accuracy of the embodiment 3.

Embodiment 4

Also with respect to the donor substrate 50 having the constitution shown in FIG. 3, after transferring the organic EL material layer 53 to the element substrate 10, the organic EL material layer 53 can be collected and reused. After collecting the organic EL material layer 53, it is desirable to reuse the donor substrate 50 having the light reflection layers 51 and the light absorption layer 52. However, the light reflection layers 51 are made of metal such as Al, an Al alloy, silver or a silver alloy and hence, there exists a large possibility that a surface of the light reflection layer 51 after collection of the organic EL material layer 53 is contaminated or damaged.

Figure 10:
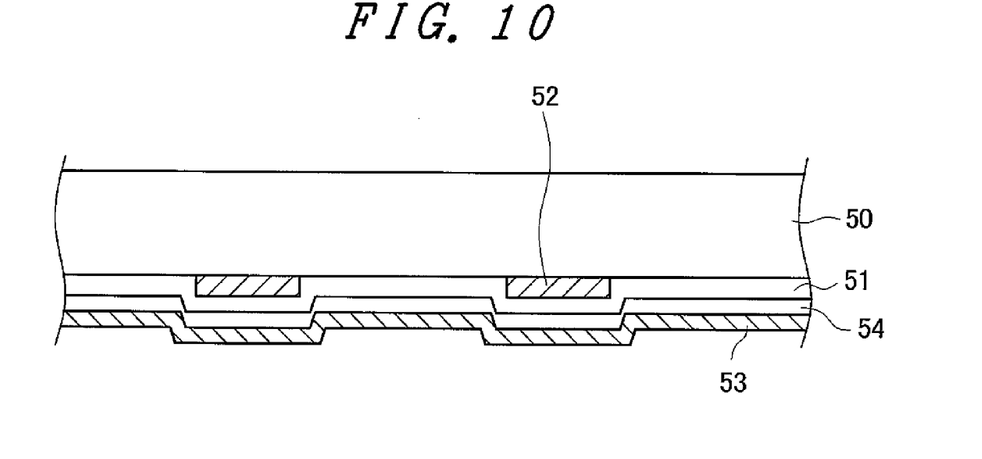
FIG. 10 is a cross-sectional view of a donor substrate of an embodiment 4.

To overcome this drawback, in this embodiment, as shown in FIG. 10, a surface protective film 54 is formed on the light absorption layers 52, and the organic EL material layer 53 is formed on the surface protective film 54. In this embodiment, the surface protective film 54 is made of SiN. SiN is chemically stable and, at the same time, possesses heat conductivity sufficient to transmit heat generated by the light absorption layers 52 to the organic EL material layer 53. In the same manner as the embodiment 2, the surface protective film 54 may be made of ITO, InZnO or the like.

In this manner, by forming the surface protective film 54 using SiN or the like, the light reflection layers 51 and the light absorption layers 52 which are formed below the SiN film are protected and hence, it is possible to repeatedly use the donor substrate 50 even after the organic EL material layer 53 is transferred and collected. Accordingly, it is possible to reduce a manufacturing cost of the organic EL display device.

Embodiment 5

Figure 11:
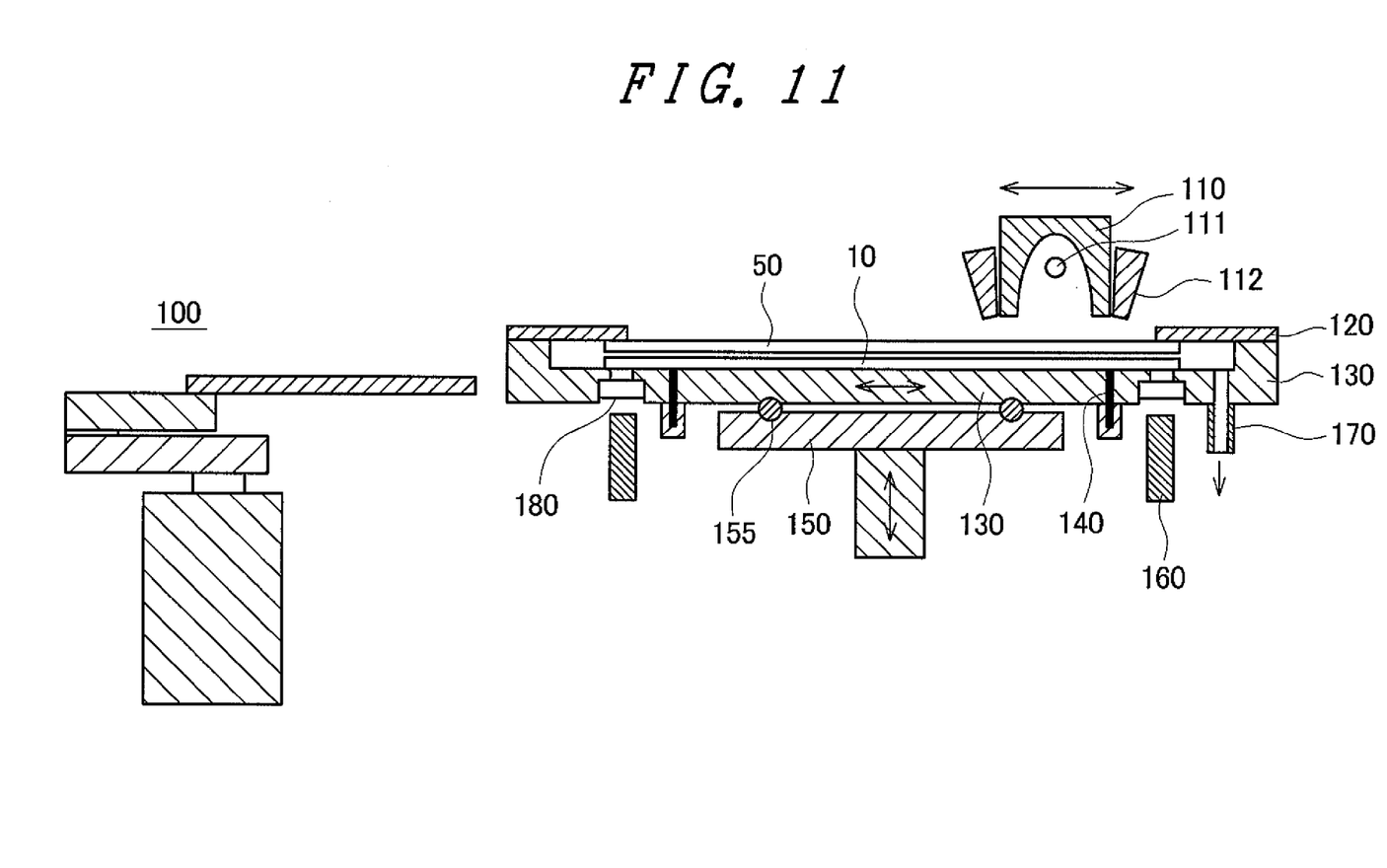
FIG. 11 is a schematic view of a transfer device of the present invention.

Next, an apparatus which forms an organic film using this method is explained in conjunction with FIG. 11. The device has a function of conveying the donor substrate 50 and the element substrate 10 and mounting the donor substrate 50 and the element substrate 10 on the device, a function of holding the donor substrate 50 by suction, a function of aligning the element substrate 10 and the donor substrate 50 with each other, a function of bringing the element substrate 10 and the donor substrate 50 into close contact with each other and reducing a pressure between the substrates after the alignment of the substrates, a function of radiating strong light to the donor substrate 50 and a function of cooling the substrates.

The manner of operation of the device is explained in accordance with steps. First of all, the donor substrate 50 is put into the inside of the device by a substrate conveying device 100, the donor substrate 50 is brought into contact with an upper holder 120, and the donor substrate 50 is fixed to the holder by vacuum suction. The element substrate 10 is put into the inside of the device, receiving pins 140 are elevated so as to receive the element substrate 10, the element substrate 10 is lowered and placed on the stage 130, and the element substrate 10 is fixed to the stage 130 by vacuum suction. The stage 130 is mounted on a plat form 150 by way of a slider 155. Next, the stage 130 is elevated so as to allow the donor substrate 50 and the element substrate 10 to approach to each other, and the alignment of both substrates is performed by displaying an alignment mark on an alignment camera 160. The alignment camera 160 detects the alignment mark by way of a window 180.

Thereafter, the stage 130 is further elevated so as to bring the donor substrate 50 and the element substrate 10 into close contact with each other, and an O-ring not shown in the drawing between the stage 130 and the upper holder 120 is brought into contact with the stage 130 and the upper holder 120 so that the inside of the device is hermetically sealed. The inside of the device is evacuated by way of a discharge pipe 170 so as to reduce a pressure inside the device, and an atmospheric pressure is applied to the donor substrate 50 from above thus completely bringing the donor substrate 50 into close contact with the element substrate 10. By setting the pressure in such a state to 10000 to 95000 pa, it is possible to acquire both the hermetic sealing property and film follow-up property. Light generated by a xenon flash lamp 111 is radiated to the substrate from above in such a state. However, the substrate has a large area so that it is difficult to radiate the whole substrate with light at a time. Accordingly, the substrate is radiated with light of the lamp by sweeping.

Although the xenon flash lamp 111 performs pulse light emission, the xenon flash lamp 111 is configured to perform sweeping at a speed that the xenon flash lamp 111 moves by half of a width that the xenon flash lamp 111 radiates light at a time until next light emission so that the same place is radiated with light twice. Accordingly, at a portion of the donor substrate 50 where the light absorption layer 52 is formed, the organic EL material layer 53 has a chance of being evaporated twice. A pulse oscillation laser or a continuous oscillation laser may be used in place of the xenon flash lamp 111. However, the laser is comparatively expensive considering an output of the laser and hence, the use of laser is disadvantageous.

After performing the transfer in such a manner, the pressure inside the device is returned to an ordinary pressure, the stage 130 is lowered, the vacuum suction is released, the substrate is pushed up by a pin, and the element substrate 10 is collected by the substrate conveying device 100. Next, the donor substrate 50 is collected thus finishing one step. Although the device performs the above-mentioned movement, the transfer step is explained in further detail. As the xenon flash lamp 111, a lamp having a thickness of 400 mm and an output of 600 J per 1 pulse may be used. A pulse width is approximately 0.1 ms. A cycle of pulse is approximately 5 Hz, and a sweeping speed of the lamp is 10 mm per second.

When light from the lamp is focused to have a width of 10 to 15 mm and such light is radiated to the donor substrate 50, the organic film is formed by patterning. The radiation intensity is approximately halved due to a loss caused by an optical system. In case of light having a width of 10 mm, the radiation intensity is 2 J/cm$^2$ within a width of 5 mm at the center of the light. The radiation intensity is inversely proportional to the width. Accordingly, by setting energy per 1 pulse to 1.5 to 3 J/cm$^2$, it is possible to form an organic EL film which exhibits favorable film follow-up property. The evaporation temperature differs depending on an organic material. However, many vapor-deposition-use organic EL materials are evaporated at a temperature of 250° C. to 350° C. and hence, the organic EL material can be transferred with energy density at such a level. The temperature elevation of the donor substrate 50 in this conditional region is not more than 10K, to eliminate a pattern error by further decreasing the influence of thermal expansion, a cold wind is supplied to a space between a lamp house 110 and the donor substrate 50 from a cooling air nozzle 112 for cooling the donor substrate 50. Due to such cooling of the donor substrate 50, it is possible to set the temperature difference between the donor substrate 50 and the element substrate 10 within 3K.

By repeating the above-mentioned transfer steps, the respective organic films consisting of the hole transport layer, the light emission layer, and the electron transport layer are formed. Thereafter, the electron injection layer and the cathode are formed by a vacuum vapor deposition method thus completing the organic EL. Thereafter, sealing of the substrates is performed under dry nitrogen atmosphere. Then, when the organic EL is turned on, it is possible to obtain an organic EL element comparable to an organic EL element which is manufactured by a method in which all steps are performed by vacuum vapor deposition with respect to initial characteristics.

On the other hand, a lifetime of organic EL element is shortened by approximately 30% compared to the organic EL element formed by vacuum vapor deposition. In view of a fact that the organic EL element has weakness for moisture and oxygen in general, the element substrate 10 is heated at a temperature of 90° C. for 10 minutes before forming the electron injection layer by vapor deposition, and dehydration and deoxidation are performed. Due to such an operation, the lifetime of the organic EL element is prolonged by approximately 10%. By forming the hole transport layer by a vapor deposition method, the lifetime of the organic EL element is further prolonged so that it is possible to restrict the difference in lifetime between the organic EL element formed by this embodiment and the organic EL element formed by performing the vacuum vapor deposition in all steps to not more than 10%. Here, the vapor deposition of the hole transport layer is performed using the mask vapor deposition. When all transfer steps of the organic layer are performed in an inert gas, the lifetime characteristic is improved, and the lifetime is substantially equal to the lifetime obtained by performing the vacuum vapor deposition in all steps.

Embodiment 6

Out of the organic film formed on the donor substrate 50, a portion of the organic film which is transferred to the element substrate 10 is not more than 30%, and the expensive organic EL material remains on the donor substrate 50. A step of collecting such remaining organic EL material is explained hereinafter. It is often the case that a solvent-based organic EL material which can be applied by spin coating is present in the organic EL material. In such a case, a film is formed on the donor substrate 50 by spin coating, a paddle is formed by applying a solvent on a spinner even after the transfer of the organic EL material, the organic EL material is dissolved for several minutes and, thereafter, the spinner is rotated thus collecting a solution in a spinning cup.

Figure 12:
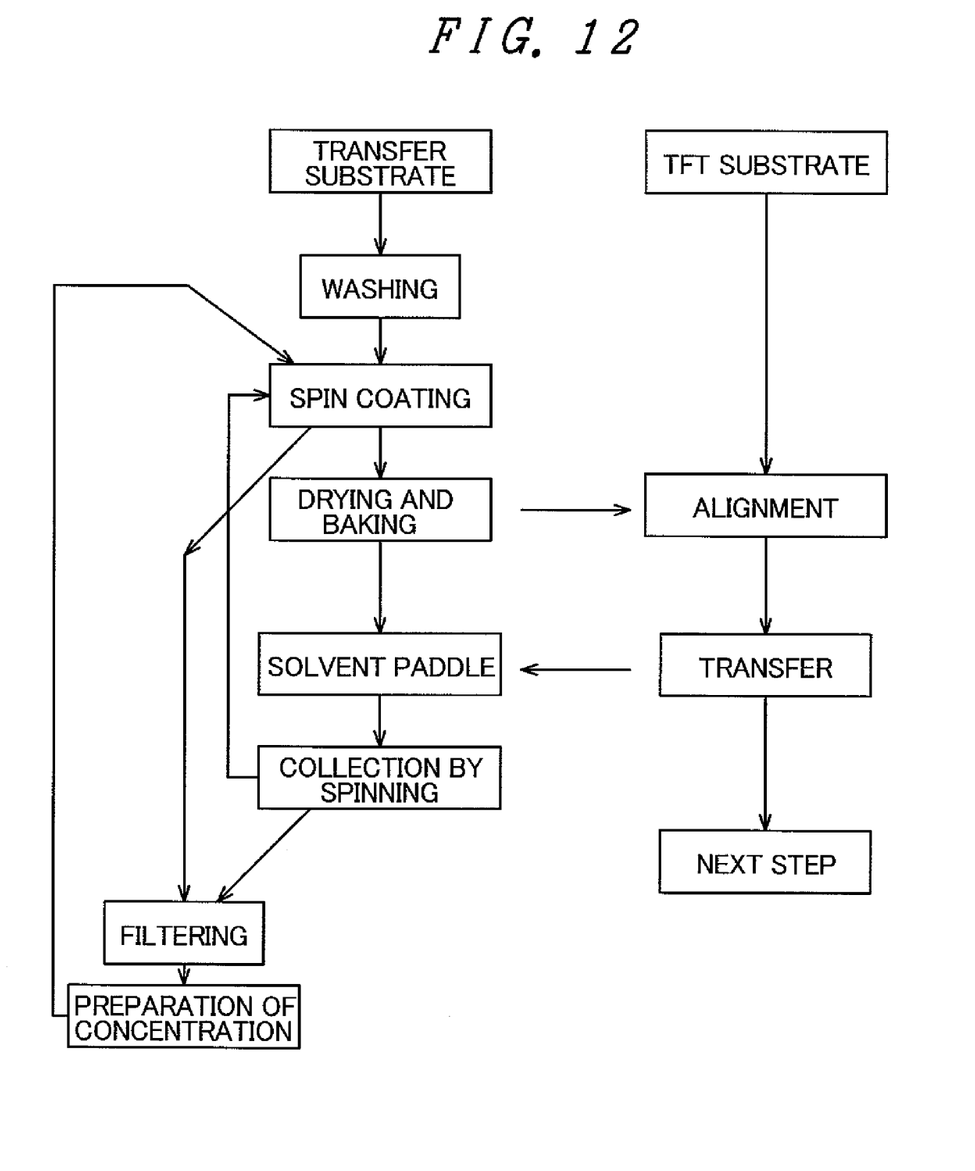
FIG. 12 is a flowchart showing an example of collecting an organic EL material layer.

After a foreign substance 60 is removed from the collected solution by filtering, the collected solution is merged with a solution collected at the time of coating, the concentration of the mixed solution is adjusted, and is again used for spin coating. The adjustment of concentration may be performed such that intensity of fluorescence spectrum is measured, and a liquid with known concentration is added or a solvent is added so as to provide specific intensity. A flowchart of steps for such an operation is shown in FIG. 12.

Figure 13:
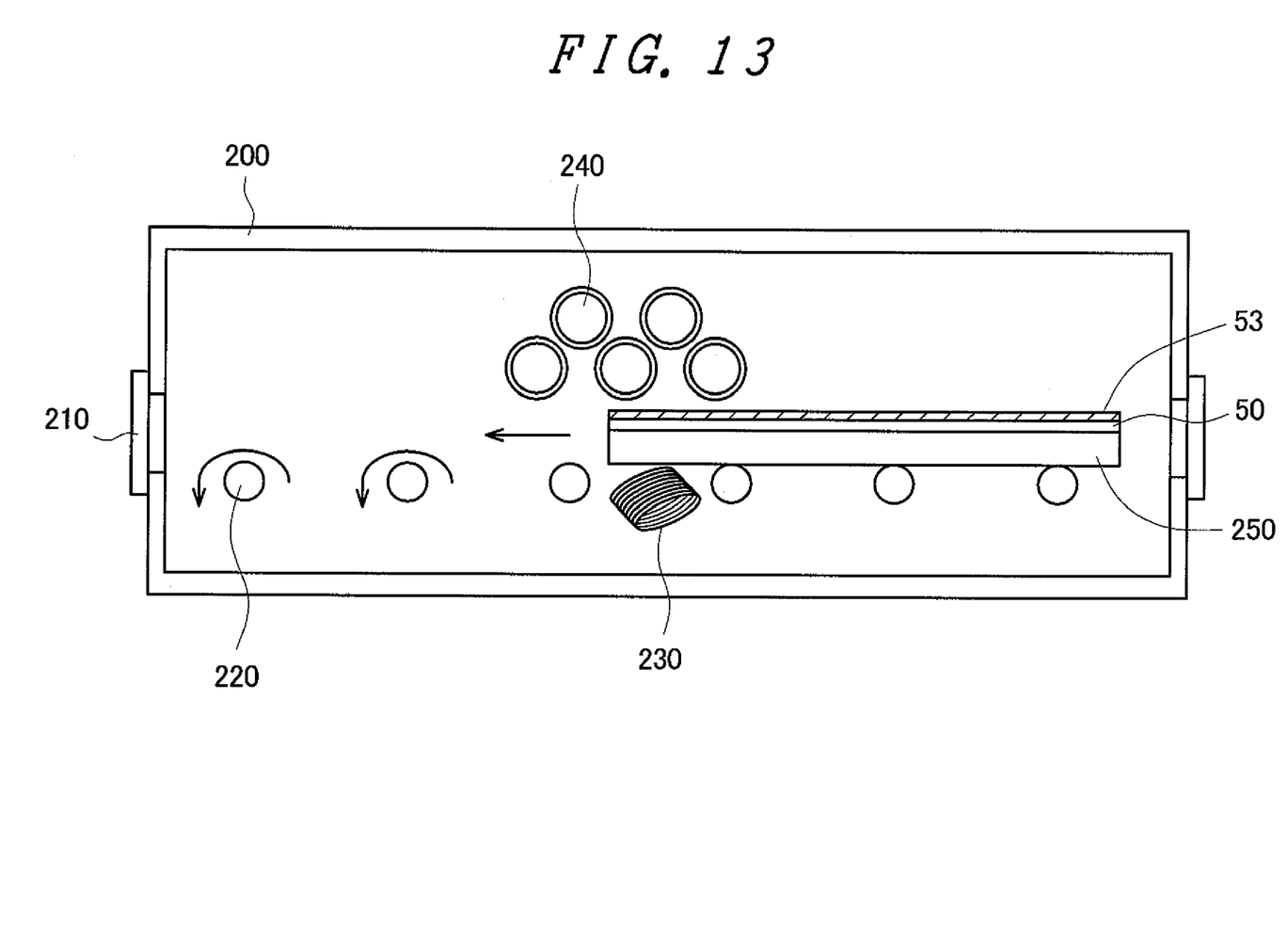
FIG. 13 is a schematic view showing another example of collecting the organic EL material layer.

A material which has difficulty in spin coating can be collected by sublimation. FIG. 13 shows the schematic constitution for collecting the material by sublimation. In a chamber 200 which can be held in vacuum of not more than 10 Pa, a coil 230 for performing induction heating of the donor substrate 50 and a cooling pipe 240 for collecting the organic EL material are arranged. The donor substrate 50 is put into such a device. The donor substrate 50 is placed on a mounting base 250, and the mounting base 250 is conveyed by conveying rollers 220.

By allowing the donor substrate 50 to pass between a heating coil and the cooling pipe 240, the donor substrate 50 is heated so that the organic EL material layer 53 is sublimated and is collected on a surface of the cooling pipe 240. The donor substrate from which the organic EL material layer 53 is collected is discharged to the outside from a gate 210 of the vacuum chamber 200.

The donor substrate 50 of the present invention has the whole surface thereof covered with a metal film, and can be efficiently and uniformly heated by induction heating and hence, it is possible to perform such collection. Here, the metal film is either the light reflection layer or the light absorption layer. The collected material may be put into a pot for collecting the material, and the film may be formed again on the donor substrate 50 by a vacuum vapor deposition method.

What is claimed is:

1. A manufacturing method of an organic EL display device which includes a TFT substrate on which pixels each of which is formed by stacking a lower electrode, an organic EL layer and an upper electrode in such order are formed in a matrix array, the manufacturing method comprising the steps of:
    arranging a donor substrate which is formed by forming a patterned light reflection layer on a substrate, forming a light absorption layer on the light reflection layer and forming an organic EL material layer on the light absorption layer in a state that the donor substrate faces the TFT substrate in an opposed manner: and
    forming an organic EL layer on said each pixel which is formed on the TFT substrate by radiating light to the donor substrate thus evaporating the organic EL material layer.

2. A manufacturing method of an organic EL display device according to claim 1, wherein the organic EL layer is formed of a plurality of layers, and out of the organic EL layer, a light emission layer and an electron transport layer are formed by evaporating an organic EL material layer for forming the light emitting layer, and the electron transport layer is formed by evaporating an organic EL material layer for forming the electron transport layer.

3. A manufacturing method of an organic EL display device according to claim 1, wherein the light is a light from a flash lamp.

4. A manufacturing method of an organic EL display device according to claim 1, wherein a surface protective film is formed on the light absorption layer.

5. A manufacturing method of an organic EL display device according to claim 2, wherein out of the organic EL layer, a hole transport layer is formed by evaporating an organic EL material layer for forming the hole transport layer.

6. A manufacturing method of an organic EL display device which includes a TFT substrate on which pixels each of which is formed by stacking a lower electrode, an organic EL layer and an upper electrode in a region surrounded by a bank in such order are formed in a matrix array, the manufacturing method comprising the steps of:
    arranging a donor substrate which is formed by forming a patterned light absorption layer on the substrate, by forming light reflection layers on the light absorption layer, and by forming an organic EL material layer on the light reflection layer in a state that the donor substrate faces the TFT substrate in an opposed manner: and
    forming an organic EL layer on said each pixel which is formed on the TFT substrate by radiating light to the donor substrate thus evaporating the organic EL material layer.

7. A manufacturing method of an organic EL display device according to claim 6, wherein the organic EL layer is formed of a plurality of layers, and out of the organic EL layer, a light emission layer and an electron transport layer are formed by evaporating an organic EL material layer for forming the light emitting layer, and the electron transport layer is formed by evaporating an organic EL material layer for forming the electron transport layer.

8. A manufacturing method of an organic EL display device according to claim 6, wherein the light is a light from a flash lamp.

9. A manufacturing method of an organic EL display device according to claim 6, wherein a surface protective film is formed on the light reflection layer.

10. A manufacturing method of an organic EL display device according to claim 7, wherein out of the organic EL layer, a hole transport layer is formed by evaporating an organic EL material layer for forming the hole transport layer.

* * * * *